US012568861B2

(12) United States Patent
Hwang et al.

(10) Patent No.: US 12,568,861 B2
(45) Date of Patent: Mar. 3, 2026

(54) MICRO SEMICONDUCTOR CHIP TRANSFER SUBSTRATE AND METHOD OF MANUFACTURING DISPLAY APPARATUS

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Dongkyun Kim, Suwon-si (KR); Dongho Kim, Seoul (KR); Hyunjoon Kim, Seoul (KR); Joonyong Park, Suwon-si (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 638 days.

(21) Appl. No.: 17/970,223

(22) Filed: Oct. 20, 2022

(65) Prior Publication Data

US 2023/0128165 A1     Apr. 27, 2023

(30) Foreign Application Priority Data

Oct. 21, 2021     (KR) ........................ 10-2021-0141367

(51) Int. Cl.
    *H01L 25/075*        (2006.01)
    *H10H 20/01*        (2025.01)
(52) U.S. Cl.
    CPC ......... *H01L 25/0753* (2013.01); *H10H 20/01* (2025.01)

(58) Field of Classification Search
    CPC ....... H01L 25/0753; H01L 2221/68318; H01L 2221/68354; H01L 2221/68363; H01L 21/67333; H10H 20/01
    See application file for complete search history.

(56) References Cited

U.S. PATENT DOCUMENTS

| | | | |
|---|---|---|---|
| 5,824,186 | A | 10/1998 | Smith et al. |
| 6,780,696 | B1 | 8/2004 | Schatz |
| 9,240,145 | B2 | 1/2016 | Ichioka et al. |
| 9,755,110 | B1 | 9/2017 | Crowder et al. |
| 10,109,658 | B2 | 10/2018 | Jeong et al. |
| 10,115,862 | B2 | 10/2018 | Zhan et al. |
| 10,211,364 | B2 | 2/2019 | Schuele et al. |
| 10,243,097 | B2 | 3/2019 | Yuen |

(Continued)

FOREIGN PATENT DOCUMENTS

| | | |
|---|---|---|
| EP | 3 352 211 A1 | 7/2018 |
| KR | 10-2020-0026676 A | 3/2020 |

(Continued)

OTHER PUBLICATIONS

European Search Report issued by the European Patent Office on Mar. 17, 2023 for European Patent Application No. 22201314.6.

(Continued)

*Primary Examiner* — Ratisha Mehta
(74) *Attorney, Agent, or Firm* — Sughrue Mion, PLLC

(57) ABSTRACT

Provided is a micro semiconductor chip transfer substrate including a base substrate, guide rails provided on the base substrate extending in a direction parallel to each other and spaced apart from each other, and a plurality of grooves provided in the base substrate between the guide rails and configured to accommodate micro semiconductor chips.

15 Claims, 18 Drawing Sheets

(56)  References Cited

U.S. PATENT DOCUMENTS

| | | | |
|---|---|---|---|
| 10,418,527 B2 | 9/2019 | Sasaki et al. | |
| 10,930,819 B2 | 2/2021 | Sasaki et al. | |
| 2005/0009303 A1 | 1/2005 | Schatz | |
| 2018/0309023 A1 | 10/2018 | Crowder et al. | |
| 2020/0090841 A1* | 3/2020 | Lee | H01C 17/281 |
| 2020/0152826 A1 | 5/2020 | Lee et al. | |
| 2020/0343426 A1* | 10/2020 | Rhee | H10H 20/8512 |
| 2021/0091257 A1 | 3/2021 | Hwang et al. | |
| 2021/0119079 A1 | 4/2021 | Hwang et al. | |
| 2021/0397045 A1 | 12/2021 | Hwang et al. | |
| 2022/0013400 A1 | 1/2022 | Hwang et al. | |
| 2022/0029046 A1 | 1/2022 | Hong et al. | |
| 2022/0102602 A1 | 3/2022 | Hwang et al. | |
| 2022/0189810 A1 | 6/2022 | Hwang et al. | |
| 2022/0351992 A1 | 11/2022 | Kim et al. | |
| 2023/0207739 A1* | 6/2023 | Park | G09F 9/3026 257/79 |
| 2024/0172480 A1* | 5/2024 | Yuan | H10K 59/1201 |

FOREIGN PATENT DOCUMENTS

| | | |
|---|---|---|
| KR | 10-2021-0088607 A | 7/2021 |
| WO | 2007/019067 A1 | 2/2007 |
| WO | 2019/192041 A1 | 10/2019 |
| WO | 2020/256203 A1 | 12/2020 |

OTHER PUBLICATIONS

Communication issued on Jun. 13, 2024 by Korean Intellectual Property Office in Korean Application No. 10-2021-0141367.

* cited by examiner

FIG. 5

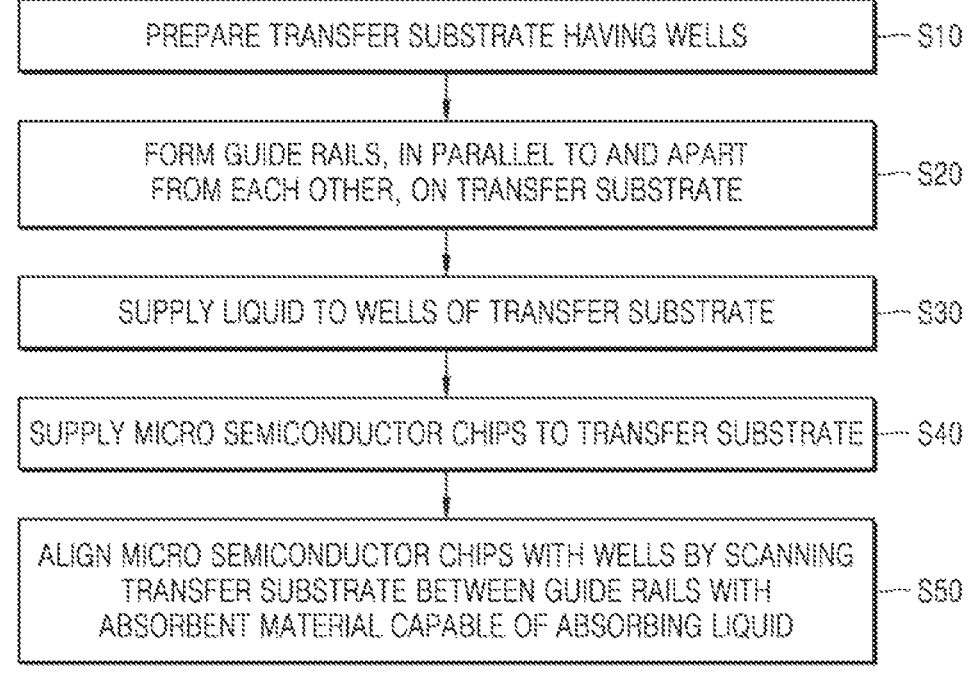

PREPARE TRANSFER SUBSTRATE HAVING WELLS — S10

FORM GUIDE RAILS, IN PARALLEL TO AND APART
FROM EACH OTHER, ON TRANSFER SUBSTRATE — S20

SUPPLY LIQUID TO WELLS OF TRANSFER SUBSTRATE — S30

SUPPLY MICRO SEMICONDUCTOR CHIPS TO TRANSFER SUBSTRATE — S40

ALIGN MICRO SEMICONDUCTOR CHIPS WITH WELLS BY SCANNING
TRANSFER SUBSTRATE BETWEEN GUIDE RAILS WITH
ABSORBENT MATERIAL CAPABLE OF ABSORBING LIQUID — S50

MICRO SEMICONDUCTOR CHIP TRANSFER SUBSTRATE AND METHOD OF MANUFACTURING DISPLAY APPARATUS

CROSS-REFERENCE TO RELATED APPLICATION

This application is based on and claims priority under 35 U.S.C. § 119 to Korean Patent Application No. 10-2021-0141367, filed on Oct. 21, 2021, in the Korean Intellectual Property Office, the disclosure of which is incorporated by reference herein in its entirety.

BACKGROUND

1. Field

Example embodiments of the present disclosure relate to a micro semiconductor chip transfer substrate and a method of manufacturing a display apparatus.

2. Description of Related Art

Liquid crystal displays (LCDs) and organic light-emitting diode (OLED) displays are widely used as display apparatuses. Recently, there has been an increasing interest in techniques for manufacturing high-resolution display apparatuses using micro light-emitting devices (micro-LEDs).

Display apparatuses employing micro-LEDs are manufactured by using many techniques such as a technique for transferring micro-LEDs having a micro size to desired pixel positions of a display apparatus, a method of repairing micro-LEDs, and a method of realizing desired colors.

SUMMARY

One or more example embodiments provide transfer structures for more precisely transferring micro semiconductor chips.

One or more example embodiments provide methods of manufacturing a display apparatus by precisely transferring micro semiconductor chips.

Additional aspects will be set forth in part in the description which follows and, in part, will be apparent from the description, or may be learned by practice of example embodiments.

According to an aspect of an example embodiment, there is provided a micro semiconductor chip transfer substrate including a base substrate, guide rails provided on the base substrate extending in a direction parallel to each other and spaced apart from each other, and a plurality of grooves provided in the base substrate between the guide rails and configured to accommodate micro semiconductor chips.

The base substrate may include a plurality of pixels, and the guide rails are extend parallel to each other in an identical direction between the plurality of pixels, wherein one among the plurality of pixels corresponds to three among the plurality of grooves.

Each of the plurality of pixels may include a first sub-pixel, a second sub-pixel, and a third sub-pixel, and a gap between a first guide rail and the first sub-pixel closest to the first guide rail and a gap between a second guide rail and the third sub-pixel closest to the second guide rail may be greater than a maximum width of the micro semiconductor chips.

Each of the plurality of pixels may include a first sub-pixel, a second sub-pixel, and a third sub-pixel, and gap between the first sub-pixel and the second sub-pixel and a gap between the second sub-pixel and the third sub-pixel may be greater than a maximum width of the micro semiconductor chips.

The base substrate may include a plurality of pixels, and two or more pixels among the plurality of pixels may be provided between the guide rails in a direction perpendicular to the direction in which the guide rails extend.

The base substrate may include a substrate and a transfer mold provided on the substrate, and the plurality of grooves may be provided in the transfer mold.

The guide rails may be configured to be attachable to and detachable from the base substrate.

The base substrate may include a plurality of pixels, each of the plurality of pixels may include a first sub-pixel, a second sub-pixel, and a third sub-pixel, and a groove included in in the first sub-pixel, a groove included in the second sub-pixel, and a groove included in the third sub-pixel may have different cross-sectional shapes from each other.

The base substrate may include a plurality of pixels, and the guide rails may include protrusions protruding between the plurality of pixels.

The plurality of grooves may include a first groove, a second groove, and a third groove, and the first groove, the second groove, and the third groove may be provided in a line in a direction perpendicular to the direction in which the guide rails extend, in a zigzag pattern, or in a diagonal direction between the guide rails.

An entrance portion of each of the guide rails may have a tapered structure having a gradually decreasing width.

The micro semiconductor chip transfer substrate may further include sub-guide rails provided between the guide rails, the sub-guide rails being configured to guide the micro semiconductor chips toward the plurality of grooves.

The micro semiconductor chip transfer substrate may further include a fine concavo-convex pattern on surfaces of the guide rails and the base substrate.

The micro semiconductor chips may include at least one of a light emitting diode (LED), a complementary metal-oxide semiconductor (CMOS), a CMOS image sensor (CIS), a vertical-cavity surface-emitting laser (VCSEL), a photo-diode (PD), a memory device, or a two-dimensional (2D) material device.

The micro semiconductor chips may be transferred in the grooves.

According to another aspect of an example embodiment, there is provided a method of manufacturing a display apparatus, the method including preparing a base substrate including a plurality of grooves, forming guide rails on the base substrate, the guide rails being spaced apart from each other and parallel to each other, supplying a liquid to the plurality of grooves in the base substrate, supplying micro semiconductor chips to the base substrate, first transferring the micro semiconductor chips with the plurality of grooves by scanning the base substrate between the guide rails with an liquid absorber configured to absorb the liquid, and second transferring the micro semiconductor chips to a driving circuit board that comprises a driving circuit.

The supplying of the liquid may be performed by a spray method, a dispensing method, an inkjet dot method, and/or a method configured to allow the liquid to flow on the base substrate.

The supplying of the liquid and the supplying of the micro semiconductor chips may be simultaneously performed.

BRIEF DESCRIPTION OF THE DRAWINGS

The above and/or other aspects, features, and advantages of example embodiments will be more apparent from the following description taken in conjunction with the accompanying drawings, in which:

FIGS. 4 and 5 are views illustrating a method of manufacturing a display apparatus according to an example embodiment;

DETAILED DESCRIPTION

Figure 1:
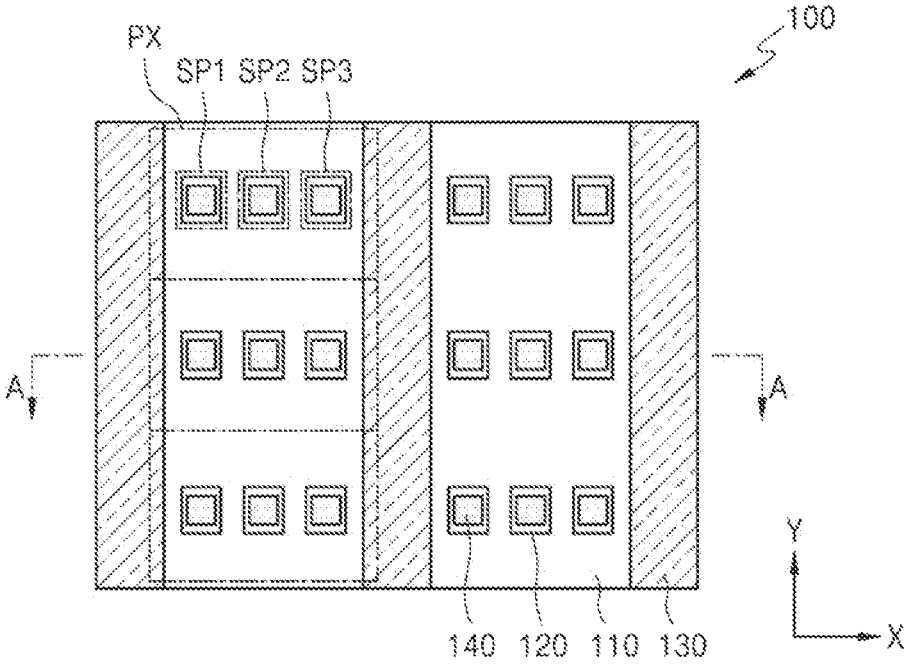
FIG. 1 is a plan view illustrating a micro semiconductor chip transfer substrate according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, micro semiconductor chip transfer substrates and method of manufacturing display apparatuses will be described according to various embodiments with reference to the accompanying drawings. In the drawings, like reference numbers refer to like elements, and the size of each element may be exaggerated for clarity of illustration. It will be understood that although the terms "first," "second," etc. may be used herein to describe various components, these components should not be limited by these terms. These terms are only used to distinguish one element from another.

As used herein, singular forms may include plural forms as groove unless the context clearly indicates otherwise. It will be further understood that the terms "comprises," "comprising," "includes," and/or "including" used herein specify the presence of stated features or elements, but do not preclude the presence or addition of one or more other features or elements. In the drawings, the size or thickness of each element may be exaggerated for clarity of illustration. Furthermore, it will be understood that when a material layer is referred to as being "on" or "above" a substrate or another layer, it can be directly on the substrate or the other layer, or intervening layers may also be present. Furthermore, in the following embodiments, a material included in each layer is an example, and another material may be used in addition to or instead of the material.

In the present disclosure, terms such as "unit" or "module" may be used to denote a unit that has at least one function or operation and is implemented with hardware, software, or a combination of hardware and software.

Specific executions described herein are merely examples and do not limit the scope of the inventive concept in any way. For simplicity of description, other functional aspects of conventional electronic configurations, control systems, software and the systems may be omitted. Furthermore, line connections or connection members between elements depicted in the drawings represent functional connections and/or physical or circuit connections by way of example, and in actual applications, they may be replaced or embodied as various additional functional connections, physical connections or circuit connections.

An element referred to with the definite article or a demonstrative pronoun may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the inventive concept unless defined by the claims.

Figure 2:
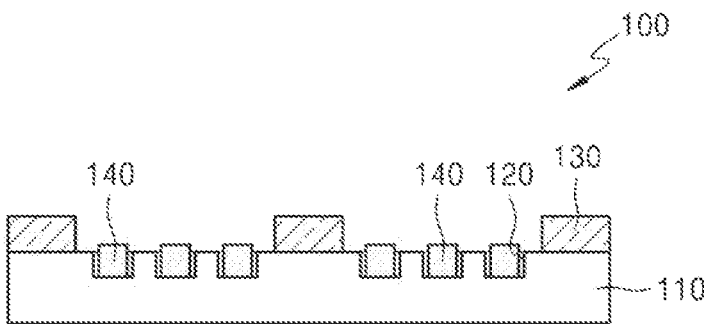
FIG. 2 is a cross-sectional view taken along line A-A of FIG. 1.

FIG. 1 is a plan view illustrating a micro semiconductor chip transfer substrate 100 according to an example embodiment, and FIG. 2 is a cross-sectional view taken along line A-A of FIG. 1.

The micro semiconductor chip transfer substrate 100 includes a base substrate 110, guide rails 130 arranged in parallel to each other at a distance from each other on the base substrate 110, and a plurality of grooves 120 provided in the base substrate 110 between the guide rails 130 to accommodate micro semiconductor chips 140.

The base substrate 110 may have a single-layered or multilayered structure. FIG. 2 illustrates an example in which the base substrate 110 has a single-layered structure. The base substrate 110 may include, for example, silicon, glass, sapphire, an organic material such as a polymer, an inorganic material, and/or a metal, and may be manufactured by a method such as patterning, etching, or molding of a photoresist. However, the base substrate 110 is not limited thereto.

The grooves 120 may be provided to place the micro semiconductor chips 140 therein. The grooves 120 may each have a cross-sectional area greater than the area of each of the micro semiconductor chips 140 to accommodate the micro semiconductor chips 140. Each of the grooves 120 may have an area in which only one micro semiconductor chip 140 may be accommodated or a plurality of micro semiconductor chips 140 may be accommodated. The grooves 120 may have a cross-sectional shape similar to the cross-sectional shape of the micro semiconductor chips 140, for example, a circular or polygonal cross-sectional shape. The grooves 120 may have a depth less than or greater than the thickness of the micro semiconductor chips 140. For example, a depth of the grooves 120 may be less than twice the thickness of the micro semiconductor chips 140, or a depth of the grooves 120 may range from 0.5 times to 1.5 times the thickness of the micro semiconductor chips 140.

The micro semiconductor chips 140 may include various types of semiconductor chips having a micro size, and the micro size may be 1000 $\mu$m or less, or 200 $\mu$m or less. The micro semiconductor chips 140 may include, for example, a light-emitting diode (LED), a complementary metal-oxide semiconductor (CMOS), a CMOS image sensor (CIS), a vertical-cavity surface-emitting laser (VCSEL), a photo diode (PD), a memory device, a two-dimensional (2D) material device, or the like. Here, examples of a 2D material may include graphene and carbon nanotubes (CNTs).

The base substrate 110 may include a plurality of pixels PX, and each of the plurality of pixels PX may include, for example, a first sub-pixel SP1, a second sub-pixel SP2, and a third sub-pixel SP3. The pixels PX may refer to basic unit regions for displaying an image on a display apparatus. The first sub-pixel SP1, the second sub-pixel SP2, and the third sub-pixel SP3 may be basic color regions for expressing colors; and a color image may be displayed by combining colors from the first sub-pixel SP1, the second sub-pixel SP2, and the third sub-pixel SP3. For example, the first sub-pixel SP1 may be a region for blue, the second sub-pixel SP2 may be a region for green, and the third sub-pixel SP3 may be a region for red.

Each of the first sub-pixel SP1, the second sub-pixel SP2, and the third sub-pixel SP3 includes a single groove 120, and a single micro semiconductor chip 140 may be accommodated in a single groove 120. However, the pixels PX and the sub-pixels of the pixels PX are not limited thereto. For example, each of the pixels PX may include four sub-pixels, and each of the sub-pixels may include a plurality of grooves 120. In addition, each of the grooves 120 may be configured to accommodate a plurality of micro semiconductor chips 140.

The guide rails 130 may be provided in parallel to the same direction between the pixels PX. Referring to FIG. 1, each of the guide rails 130 extends in a Y direction, and the guide rails 130 are spaced apart from each other in an X direction and are parallel to each other. FIG. 1 illustrates an example in which the guide rails 130 extending in the Y direction are arranged at intervals of one pixel PX. However, embodiments are not limited thereto. For example, the guide rails 130 extending in the Y direction may be arranged at intervals of two pixels PX or at intervals of three pixels PX. When the micro semiconductor chips 140 are transferred to the base substrate 110 by scanning, the guide rails 130 may guide the micro semiconductor chips 140 to reduce the number (omission rate) of micro semiconductor chips 140 not entering the grooves 120 and increase the rate of transfer. The guide rails 130 may be higher than the base substrate 110, and thus the micro semiconductor chips 140 may be prevented from moving to other regions from initial regions over the guide rails 130. Furthermore, in the initial regions, the micro semiconductor chips 140 may be transferred to empty grooves 120 while being moved between the guide rails 130.

The guide rails 130 may include, for example, silicon oxide ($SiO_2$), silicon (Si), silicon nitride (SiN), aluminum nitride (AlN), aluminum oxide ($Al_2O_3$), nickel dioxide ($NiO_2$), and/or a photoresist. According to another example embodiment, the guide rails 130 may include a metal. For example, the guide rails 130 may include silver (Ag), gold (Au), platinum (Pt), nickel (Ni), chromium (Cr), and/or aluminum (Al).

Figure 3:
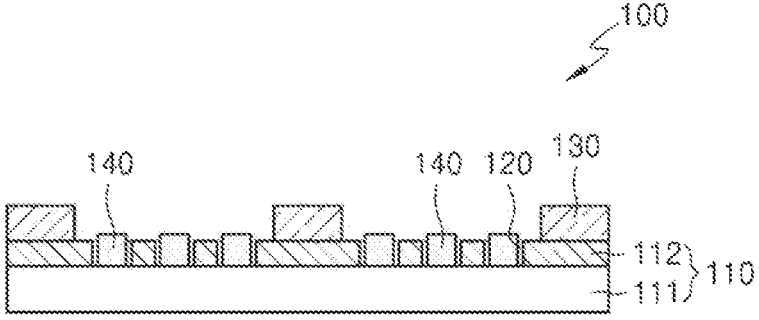
FIG. 3 is a view illustrating an example of a base substrate of the micro semiconductor chip transfer substrate shown in FIG. 1 which includes a substrate and a transfer mold.

Compared to FIG. 1, in FIG. 3 a base substrate 110 has two layers. Elements denoted with the same reference numerals as those used in FIG. 1 have substantially the same functions and operations, and thus detailed descriptions thereof will be omitted. The base substrate 110 may include a substrate 111 and a transfer mold 112 provided on a surface of the substrate 111. The transfer mold 112 may include a plurality of grooves 120 provided in the form of through-holes or wells. The substrate 111 may include silicon, glass, and/or sapphire, and the transfer mold 112 may include $SiO_2$, Si, SiN, a photoresist, or a metal.

Figure 4:
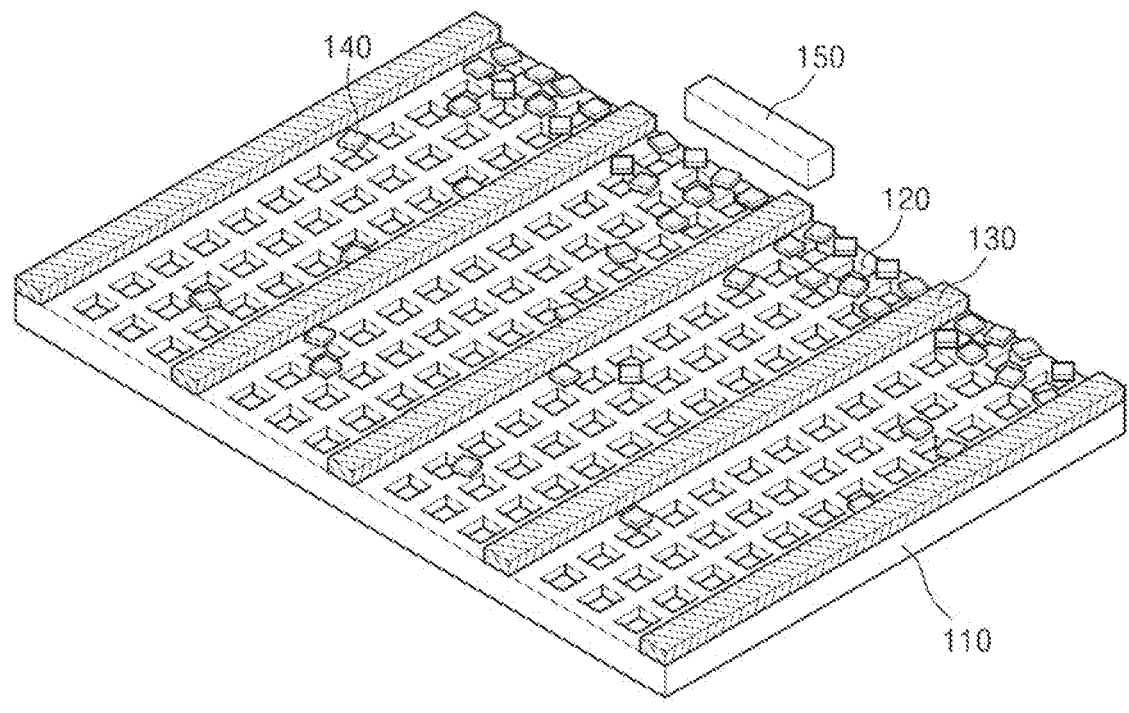

FIGS. 4 and 5 are views illustrating a method of manufacturing a display apparatus using a transfer structure according to an example embodiment.

Referring to FIGS. 4 and 5, a base substrate 110 including a plurality of grooves 120 is prepared (S10). Guide rails 130, which are parallel to each other at a distance from each other, are formed on the base substrate 110 (S20). Then, a liquid is supplied to the grooves 120 of the base substrate 110 (S30). Here, any type of liquid may be used as long as the liquid does not corrode or damage micro semiconductor chips 140. For example, the liquid may include at least one selected from the group consisting of water, ethanol, alcohol, polyol, ketone, halocarbon, acetone, flux, and an organic solvent.

The organic solvent may include, for example, isopropyl alcohol (IPA). The liquid is not limited thereto, and other various liquids may be used as the liquid.

Various methods, such as a spray method, a dispensing method, an inkjet dot method, or a method of allowing a liquid to flow on the base substrate 110, may be used to supply the liquid to the grooves 120. The supply amount of the liquid may be adjusted such that the grooves 120 may be just filled with the liquid or overflow with the liquid.

A plurality of micro semiconductor chips 140 are supplied to the base substrate 110 (S40). The micro semiconductor chips 140 may be directly sprayed onto the base substrate 110 without using any other liquid or may be supplied in a state in which the micro semiconductor chips 140 are included in a suspension. The micro semiconductor chips 140 included in the suspension may be supplied by various methods such as a spray method, a method of dispensing the suspension by dripping the suspension, an inkjet dot method in which the suspension is ejected as in a printer, or a method of allowing the suspension to flow on the base substrate 110.

The micro semiconductor chip 140 are aligned with the grooves 120 by scanning the base substrate 110 between the guide rails 130 with a liquid absorber 150 capable of absorbing the liquid (S104). The type or structure of the liquid absorber 150 are not limited as long as the absorbent 150 is capable of absorbing the liquid. The liquid absorber 150 may include, for example, woven fabric, tissue, polyester fiber, paper, or a wiper. Regions of the base substrate 110 between the guide rails 130 may be scanned with the liquid absorber 150 while being pressed with the liquid absorber 150. The scanning may include a process in which the liquid absorber 150 absorbs the liquid while the liquid absorber 150 passes over the grooves 120 in contact with the base substrate 110. For example, the scanning may be performed using the liquid absorber 150 by a sliding method, a rotating method, a translational motion method, a reciprocating motion method, a rolling method, a spinning method, and/or a rubbing method, and the method of scanning may include both regular and irregular methods. In addition, liquid absorbers 150 may be provided between the guide rails 130 to simultaneously perform scanning between the guide rails 130.

Operation S30 of supplying the liquid to the grooves 120 of the base substrate 110 and operation S40 of supplying the micro semiconductor chips 140 to the base substrate 110 may be performed in reverse order. In addition, operation S30 of supplying the liquid to the grooves 120 of the base substrate 110 and operation S40 of supplying the micro semiconductor chips 140 to the base substrate 110 may be simultaneously performed as one operation. For example, the liquid and the micro semiconductor chips 140 may be simultaneously supplied to the base substrate 110 by supplying a suspension containing the micro semiconductor chips 140 to the base substrate 110.

After scanning the base substrate 110 with the liquid absorber 150, dummy micro semiconductor chips, which are not in the grooves 120 but remain on the base substrate 110, may be removed. Operations S30 to S50 may be repeated, and through these operations, the micro semiconductor chips 140 may be more rapidly transferred to the base substrate 110. In addition, because the micro semiconductor chips 140 are distributed between the guide rails 130 and are aligned with the grooves 120 by scanning between the guide rails 130, in a state in which the micro semiconductor chips 140 are confined by the guide rails 130 between which the micro semiconductor chips 140 are initially distributed, the number (omission rate) of micro semiconductor chips 140 not entering the grooves 120 may decrease compared to the case in which the guide rails 130 are not provided. As the omission rate of the micro semiconductor chips 140 decreases, a repair process may be significantly reduced. In addition, because the micro semiconductor chips 140 are uniformly distributed between the guide rails 30, the number of micro semiconductor chips 140 to be initially supplied to the base substrate 110 may be reduced, and a cleaning process for removing remaining micro semiconductor chips 140 may be significantly reduced.

A pick-and-place method may be used to transfer semiconductor chips having a micro size. In this case, however, the size of semiconductor chips transferable by the pick-and-place method is limited, and as the number of semiconductor chips to be transferred increases, it becomes more difficult to use the pick-and-place method. When micro semiconductor chips are employed in a display apparatus as pixel light sources, it may be technically difficult to transfer tens of millions of micro semiconductor chips to exact positions. According to the embodiments, however, the micro semiconductor chip transfer substrate 100 and the transfer method using the micro semiconductor chip transfer substrate 100 make it possible to more precisely transfer a large number of semiconductor chips by a fluidic self-assembly transfer method. In addition, the guide rails 130, which are parallel to each other and arranged in one direction, may reduce the number of micro semiconductor chips 140 to be used, improve the efficiency of transfer, and simplify a cleaning process.

Figure 6:
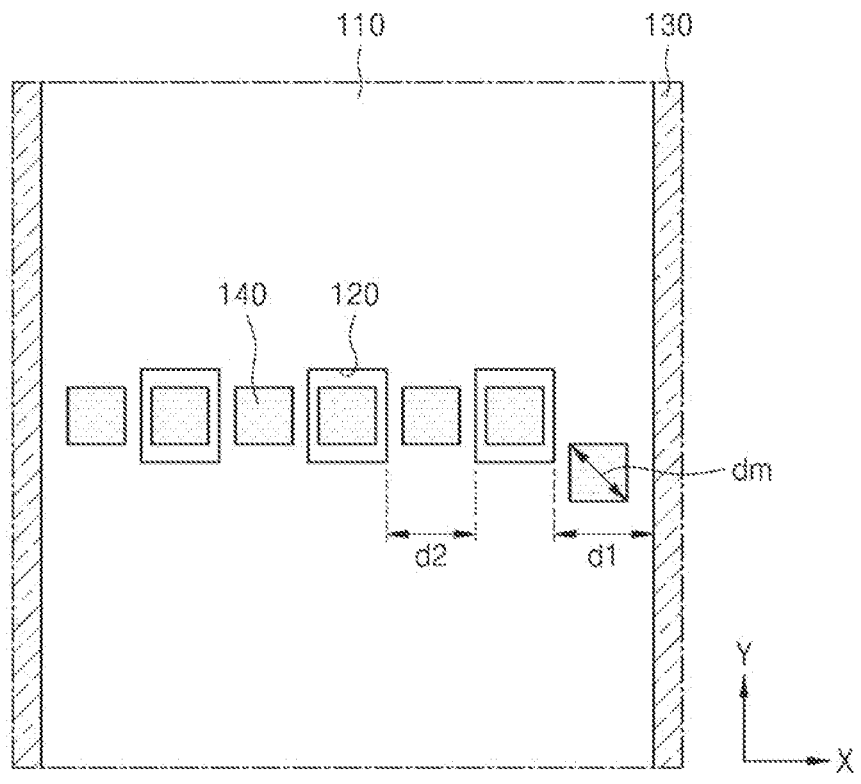
FIG. 6 is a view illustrating a transfer structure in which micro semiconductor chips are arranged in a line according to an example embodiment.

FIG. 6 illustrates an example arrangement of grooves 120 and guide rails 130 in a pixel. The grooves 120 may be arranged in a line in a direction (X direction) perpendicular to the guide rails 130. Gaps d1 between guide rails 130 and grooves 120 closest to the guide rails 130 may be greater than the maximum width dm of micro semiconductor chips 140 such that the micro semiconductor chips 140 may pass through the gap d1. The micro semiconductor chips 140 may have various cross-sectional shapes. For example, when the micro semiconductor chips 140 have a rectangular cross-sectional shape, the maximum width dm of the micro semiconductor chips 140 may be the diagonal length of the micro semiconductor chips 140. When the gaps d1 between the grooves 120 and the guide rails 130 are set as described above, passages through which the micro semiconductor chips 140 may be moved forward during scanning with the micro semiconductor chips 140 may be guaranteed.

According to another example embodiment, gaps d2 between adjacent grooves 120 may be greater than the maximum width dm of the micro semiconductor chips 140. This may also guarantee passages through which the micro semiconductor chips 140 may be moved forward during scanning with the micro semiconductor chips 140.

Figure 7:
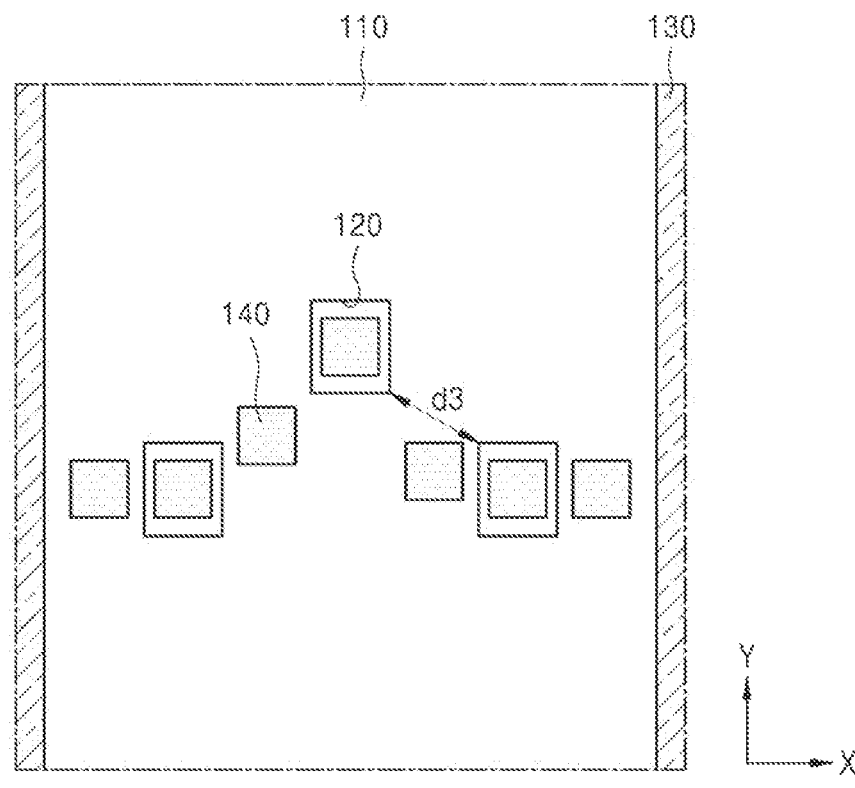
FIG. 7 is a view illustrating a transfer structure in which micro semiconductor chips are arranged in zigzag according to an example embodiment.

FIG. 7 illustrates another example arrangement of grooves 120 and guide rails 130 according to an example embodiment.

The grooves 120 may be arranged in a zigzag pattern between the guide rails 130. The shortest distance d3 between adjacent grooves 120 may be greater than the maximum width dm of micro semiconductor chips 140. Therefore, the micro semiconductor chips 140 may pass between the adjacent grooves 120.

Figure 8:
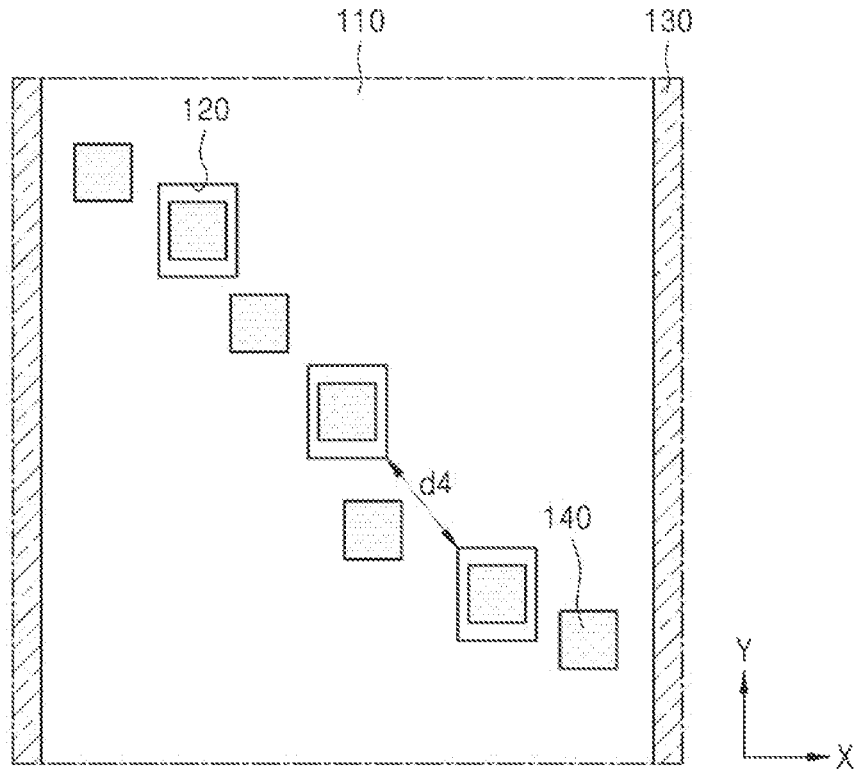
FIG. 8 is a view illustrating a transfer structure in which micro semiconductor chips are arranged in a diagonal direction according to an example embodiment.

FIG. 8 illustrates another example arrangement of grooves 120 and guide rails 130 according to an example embodiment. The shortest distance d4 between adjacent grooves 120 may be greater than the maximum width dm of micro semiconductor chips 140.

Figure 9:
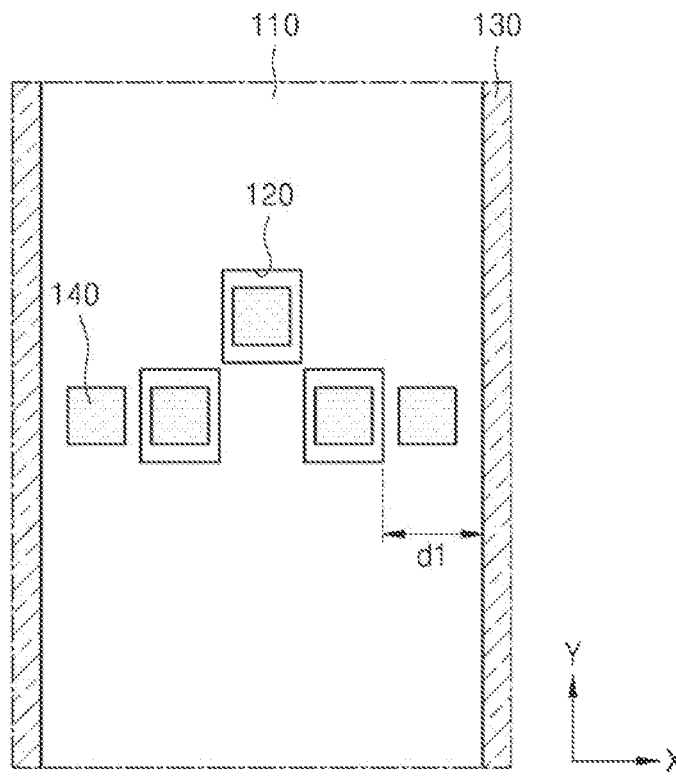
FIG. 9 is a view illustrating another transfer structure in which micro semiconductor chips are arranged in zigzag according to an example embodiment.

FIG. 9 illustrates an example in which grooves 120 are arranged in a zigzag pattern. Gaps between the grooves 120 may be less than the maximum width dm of micro semiconductor chips 140, and gaps d1 between guide rails 130 and grooves 120 closest to the guide rails 130 may be greater than the maximum width dm of the micro semiconductor chip 140. In this case, the micro semiconductor chips 140 may not pass between the grooves 120, but may pass between the grooves 120 and the guide rails 130.

Figure 10:
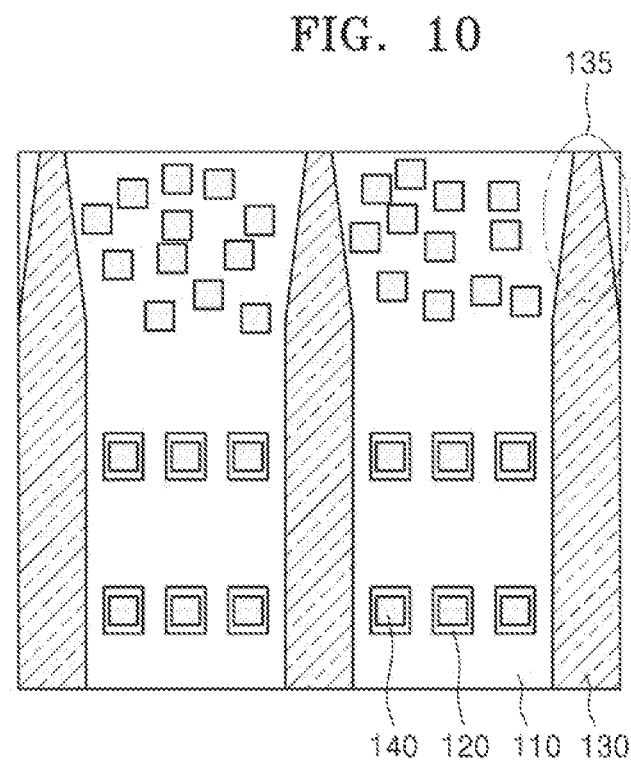
FIG. 10 is a view illustrating an example of a micro semiconductor chip transfer substrate having a tapered shape according to an example embodiment.

FIG. 10 illustrates an example in which the guide rails 130 of the micro semiconductor chip transfer substrate 100 shown in FIG. 1 are modified according to another example embodiment. An entrance portion of each of the guide rails 130 may have a tapered structure 135 of which the width gradually decreases. In this case, inlets between the guide rails 130 may be wider than other portions, and thus, more micro semiconductor chips 140 may be supplied through the inlets which are wider than the other portions.

Figure 11:
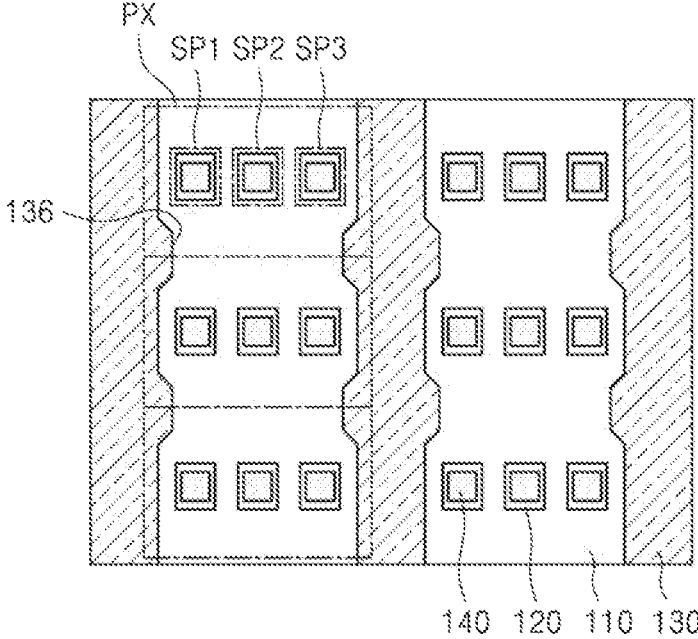
FIG. 11 is a view illustrating an example of a micro semiconductor chip transfer substrate including protrusions formed on guide rails according to an example embodiment.

FIG. 11 illustrates an example in which protrusions 136 are further provided on the micro semiconductor chip transfer substrate 100 shown in FIG. 1 according to another example embodiment. The protrusions 136 may be provided on the guide rails 130 between the pixels PX and may protrude toward the pixels PX. When micro semiconductor chips 140 are moved forward during scanning, the protrusions 136 may guide the micro semiconductor chips 140 such that the micro semiconductor chips 140 may more effectively enter the next grooves 120.

Figure 12:
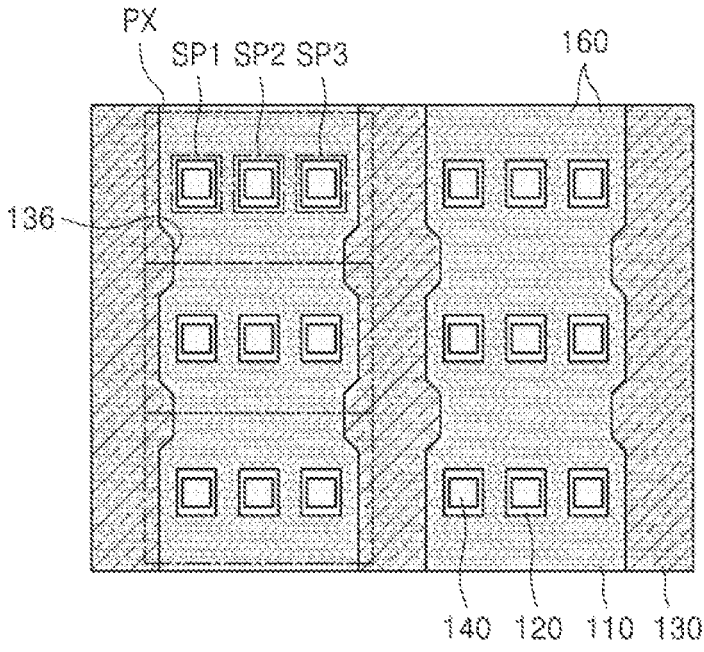
FIG. 12 is a view illustrating an example of a micro semiconductor chip transfer substrate including a fine concavo-convex pattern according to an example embodiment.

FIG. 12 illustrates an example in which a fine concavo-convex pattern 160 is further provided on the micro semiconductor chip transfer substrate 100 shown in FIG. 11 according to another example embodiment. The fine concavo-convex pattern 160 may be further provided on the guide rails 130 and the base substrate 110. Due to the fine concavo-convex pattern 160, micro semiconductor chips 140 remaining on the base substrate 110 or the guide rails 130 may be more easily removed. The fine concavo-convex pattern 160 reduces adhesion between the remaining micro semiconductor chips 140 and the guide rails 130 or adhesion between the remaining micro semiconductor chips 140 and the base substrate 110, and thus the remaining micro semiconductor chips 140 may be more easily removed.

Figure 13:
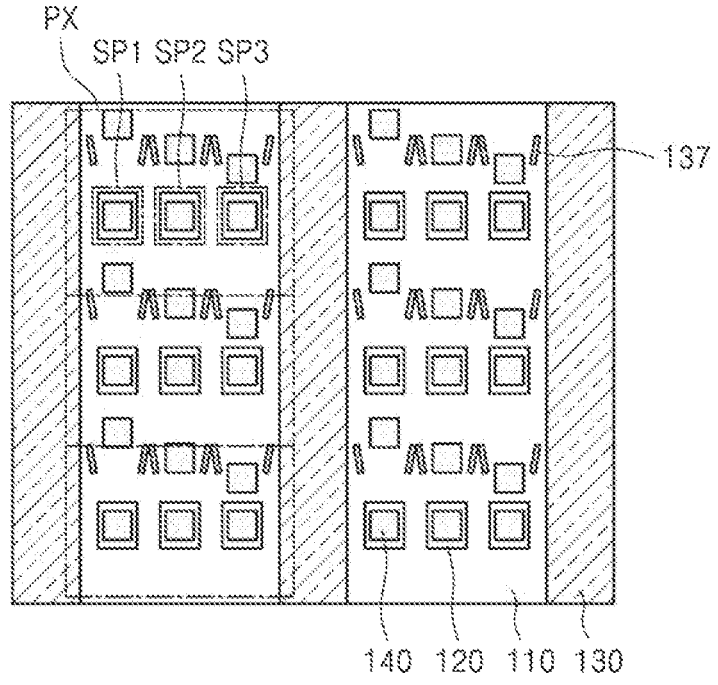
FIG. 13 is a view illustrating an example of a micro semiconductor chip transfer substrate including sub-guide rails according to an example embodiment.

FIG. 13 illustrates an example in which sub-guide rails 137 are further provided on the micro semiconductor chip transfer substrate 100 shown in FIG. 1. The sub-guide rails 137 may be further provided between the guide rails 130 to guide micro semiconductor chips 140 toward the grooves 120 in regions between the guide rails 130. The sub-guide rails 137 may be provided to form passages respectively toward the first sub-pixels SP1, the second sub-pixels SP2, and the third sub-pixels SP3. The sub-guide rails 137 may have a tapered structure of which the width decreases in a direction toward a corresponding sub-pixel. A distance between the sub-guide rails 137 of a pair of sub-guide rails 137 in X direction may decrease in a direction toward a corresponding sub-pixel. However, the sub-guide rails 137 are not limited thereto, and may be arranged in parallel to each other.

Figure 14:
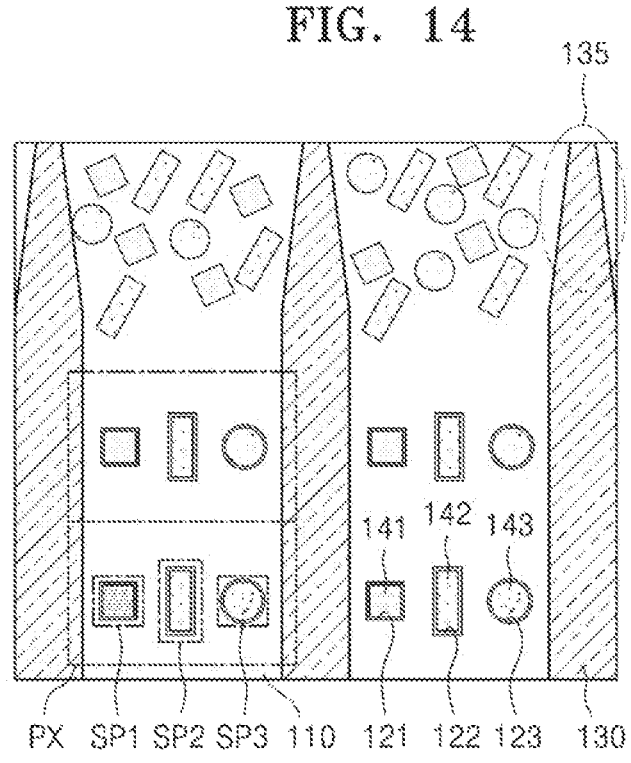
FIG. 14 is a view illustrating an example of a micro semiconductor chip transfer substrate including grooves having different shapes in sub-pixels according to an example embodiment.

FIG. 14 illustrates a micro semiconductor chip transfer substrate according to another example embodiment.

A base substrate 110 may include a plurality of pixels PX, and each of the pixels PX may include a first sub-pixel SP1, a second sub-pixel SP2, and a third sub-pixel SP3. Grooves having different cross-sectional shape may be provided in the first sub-pixel SP1, the second sub-pixel SP2, and the third sub-pixel SP3. For example, a first groove 121 having a square shape may be provided in the first sub-pixel SP1, a second groove 122 having a rectangular shape may be provided in the second sub-pixel SP2, and a third groove 123 having a circular shape may be provided in third sub-pixel SP3. In addition, a first micro semiconductor chip 141 corresponding to the first groove 121 may be provided, a second micro semiconductor chip 142 corresponding to the second groove 122 may be provided, and a third micro semiconductor chip 143 corresponding to a third groove 123 may be provided. For example, the first micro semiconductor chip 141 may emit blue light, the second micro semiconductor chip 142 may emit green light, and the third micro semiconductor chip 143 may emit red light. Because the first groove 121, the second groove 122, and the third groove 123 have different shapes, the first micro semiconductor chip 141, the second micro semiconductor chip 142, and the third micro semiconductor chip 143, which emit light having different colors, may be simultaneously supplied and transferred.

Figure 15:
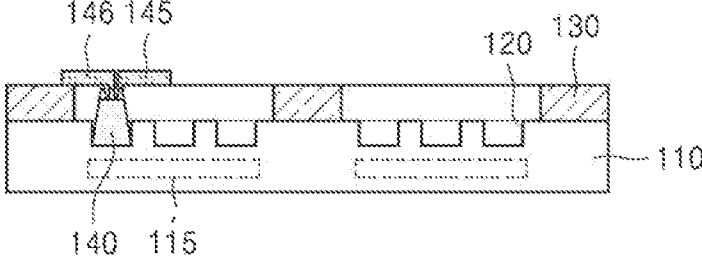
FIG. 15 is a view illustrating an example of a base substrate of a micro semiconductor chip transfer substrate, the base substrate including a driving circuit according to an example embodiment.

FIG. 15 illustrates an example in which a base substrate 110 is configured as a driving circuit board. The base substrate 110 may include a driving circuit 115. The driving circuit 115 may include a transistor, a switch transistor, and a capacitor. A first electrode 145 and a second electrode 146 may be electrically connected to a micro semiconductor chip 140, and the driving circuit 115 may be connected to the first electrode 145 and the second electrode 146. In this case, through the first electrode 145 and the second electrode 146 which are exposed to the outside, the driving circuit 115 may be connected from an upper side by a metal lift-off method. The micro semiconductor chip transfer substrate shown in FIG. 15 may be applied to, for example, an red-green-blue (RGB) self-emissive micro-LED television (TV). According to an example embodiment, the micro semiconductor chip transfer substrate may be used in a display apparatus without retransfer of micro semiconductor chips 140.

Figure 16:
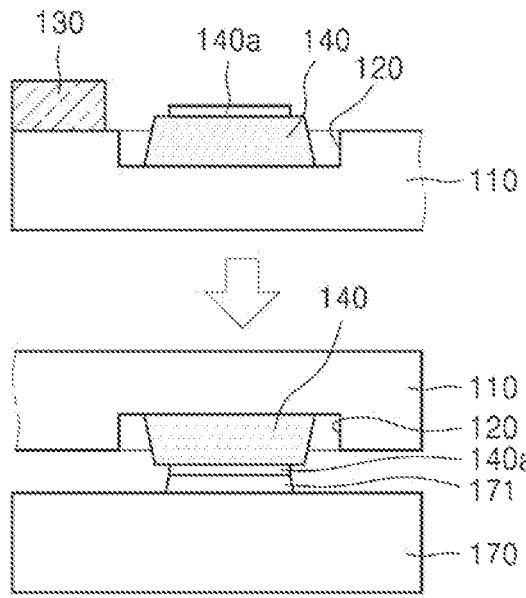
FIGS. 16, 17, and 18 are views illustrating an example of retransferring micro semiconductor chips to a driving circuit board from a micro semiconductor chip transfer substrate according to an example embodiment.
Figure 17:
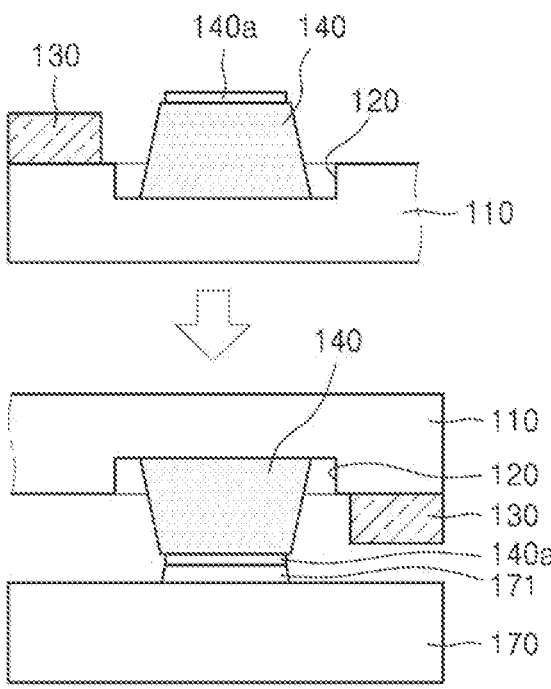
Figure 18:
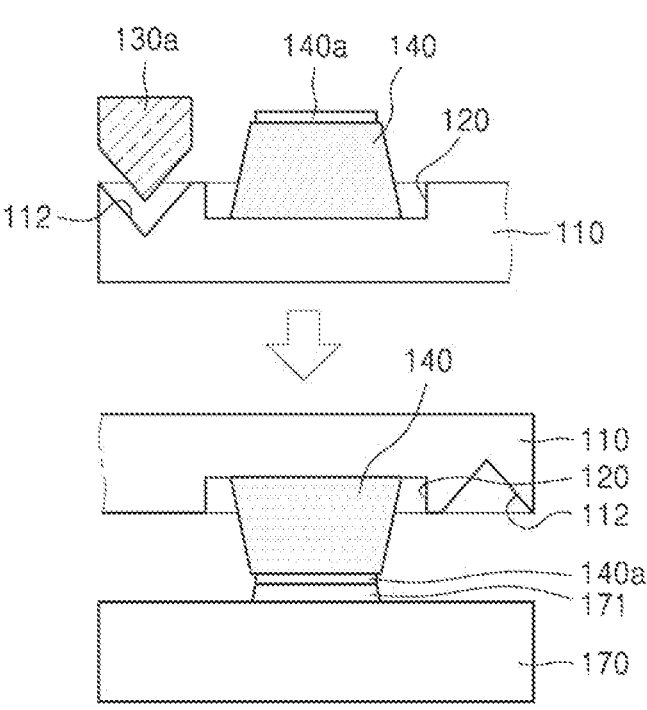

FIGS. 16 to 18 illustrate examples in which micro semiconductor chips that has been primarily transferred to transfer structures are retransferred to other substrates according to example embodiments.

Referring to FIG. 16, a micro semiconductor chip 140 may be arranged and transferred, that is, first transferred in a groove 120 of a base substrate 110, and an electrode 140a may be provided on the upper surface of the micro semiconductor chip 140. The micro semiconductor chip 140 may have a thickness greater than the depth of the groove 120, and the upper surface of the electrode 140a may be lower than the upper surface of a guide rail 130. The guide rail 130 may be removed, and then the micro semiconductor chip 140 may be retransferred, that is, second transferred to a driving circuit board 170. An electrode pad 171, which is to be connected to the electrode 140a, may be provided on the driving circuit board 170.

Referring to FIG. 17, a micro semiconductor chip 140 may have a thickness greater than the depth of a groove 120, and the upper surface of an electrode 140a may be higher than the upper surface of a guide rail 130. In a state in which the guide rail 130 is not removed, the micro semiconductor chip 140 may be retransferred to a driving circuit board 170. Because the upper surface of the electrode 140a is higher than the upper surface of the guide rail 130, the guide rail 130 may not interfere with the driving circuit board 170 even when the micro semiconductor chip 140 is retransferred, that is, second transferred to the driving circuit board 170 in a state in which the guide rail 130 is not removed.

Referring to FIG. 18, a base substrate 110 may further include a guide groove 112, and a guide rail 130a may be detachably coupled to the guide groove 112. After a micro semiconductor chip 140 is transferred to a groove 120, the guide rail 130*a* may be more easily removed. Thereafter, the micro semiconductor chip 140 may be retransferred to a driving circuit board 170.

Each of the micro semiconductor chip transfer substrates of the example embodiments is configured such that when the interval of pixels is, for example, 500 μm, and micro semiconductor chips 140 having a size of, for example, 50 μm are used, the guide rails 130 may allow the micro semiconductor chips 140 to move only within the pixel interval (500 pin) to improve the efficiency of aligning the micro semiconductor chips 140 with grooves. Because the guide rails 130 are provided only in one direction, scanning may be more easily performed only in one direction without having to scan a base substrate in multiple directions, and thus the transfer time may be significantly reduced. In addition, due to the guide rails 130, remaining micro semiconductor chips 140 which do not enter grooves 120 are confined in regions between the guide rails 130, and thus a cleaning process for removing the remaining micro semiconductor chips 140 may be more efficiently performed. Because micro semiconductor chips 140, which are sprayed in a state in which the micro semiconductor chips 140 are contained in a solution, do not move over the guide rails 130 which are higher than the base substrate but move only in one direction, the micro semiconductor chips 140 may be aligned with the grooves 120 with a high probability, and thus the yield of a transfer process may be increased.

As described above, there may be many examples in which the structure of a mold is modified to increase the efficiency of transfer. In a pick-and-place method of related art, molds may have a standardized form to place all chips at exact positions.

Figure 19:
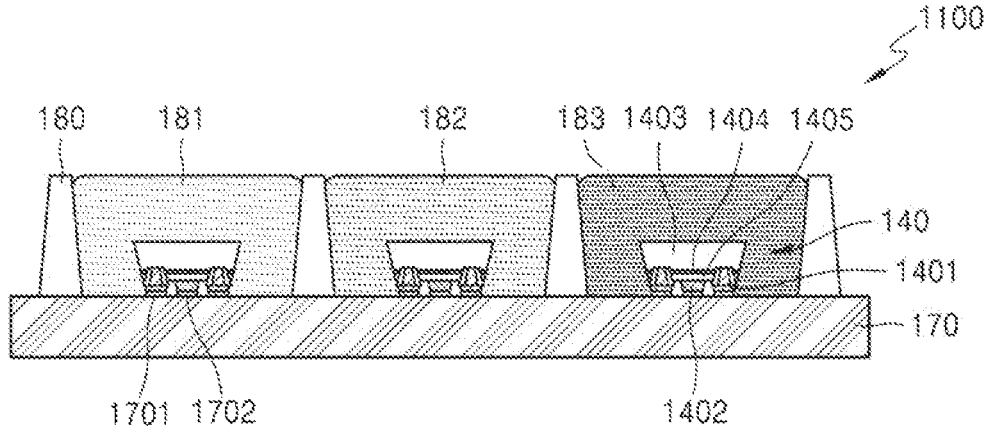
FIGS. 19, 20, and 21 are views illustrating examples of micro semiconductor chip transfer substrates including color conversion layers according to example embodiments.

FIG. 19 illustrates a micro semiconductor chip transfer substrate 1100 according to another example embodiment.

The micro semiconductor chip transfer substrate 1100 may include a driving circuit board 170 including a transistor and a capacitor. For example, the micro semiconductor chips 140 arranged on the base substrate 110 shown in FIG. 1 may be transferred and bonded to the driving circuit board 170. Each of the micro semiconductor chips 140 may include an n-type semiconductor layer 1403, an active layer 1404, and a p-type semiconductor layer 1405. The positions of the n-type semiconductor layer 1403 and the p-type semiconductor layer 1405 are interchangeable. The n-type semiconductor layer 1403 may be an n-type GaN layer, the p-type semiconductor layer 1405 may be a p-type GaN layer, and the active layer 1404 may have a quantum groove structure or a multi-quantum groove structure. Each of the micro semiconductor chips 140 may have a horizontal electrode structure, and a first electrode 1401 and a second electrode 1402 may be arranged on the same side of the micro semiconductor chip 140.

The driving circuit board 170 may include a first circuit 1701 and a second circuit 1702, and when the micro semiconductor chip 140 is transferred, the first electrode 1401 may be connected to the first circuit 1701 and the second electrode 1402 may be connected to the second circuit 1702.

Barriers 180 may be provided on the driving circuit board 170 at a distance from each other, and color conversion layers may be provided between the barriers 180. The color conversion layers may include a first color conversion layer 181 that converts light from a micro semiconductor chip 140 into light having a first color, a second color conversion layer 182 that converts light from a micro semiconductor chip 140 into light having a second color, and a third color conversion layer 183 that converts light from a micro semiconductor chip 140 into light having a third color. The micro semiconductor chips 140 may emit light having the first color, for example, blue light. However, this is merely an example, and the micro semiconductor chips 140 may emit light having a different wavelength capable of exciting the color conversion layers. The second color may be, for example, green, and the third color may be, for example, red.

When the micro semiconductor chips 140 emit blue light, the first color conversion layer 181 may include a resin that transmits blue light without converting the blue light. The second color conversion layer 182 may convert blue light emitted from the micro semiconductor chip 140 into green light. The second color conversion layer 182 may include quantum dots (QDs) that emit green light when excited by blue light, and the quantum dots may have a core-shell structure having a core and a shell or a particle structure not having a shell. The core-shell structure may be a single-shell structure or a multi-shell structure such as a double-shell structure.

The quantum dots may include a Group II-VI semiconductor, a Group III-V semiconductor, a Group IV-VI semiconductor, a Group IV semiconductor, and/or graphene quantum dots. The quantum dots may include, for example, cadmium (Cd), selenium (Se), zinc (Zn), sulfur (S), and/or indium phosphide (InP), and each of the quantum dots may have a diameter less than or equal to several tens of nanometers (nm), for example, a diameter less than or equal to about 10 nm.

The second color conversion layer 182 may include phosphor, which emits green light when excited by blue light emitted from the micro semiconductor chip 140.

The third color conversion layer 183 may convert blue light emitted from the micro semiconductor chip 140 into red light. The third color conversion layer 183 may include quantum dots, which have a predetermined size and emit red light when excited by blue light emitted from the micro semiconductor chip 140, or may include phosphor, which emits red light when excited by blue light emitted from the micro semiconductor chip 140.

Figure 20:
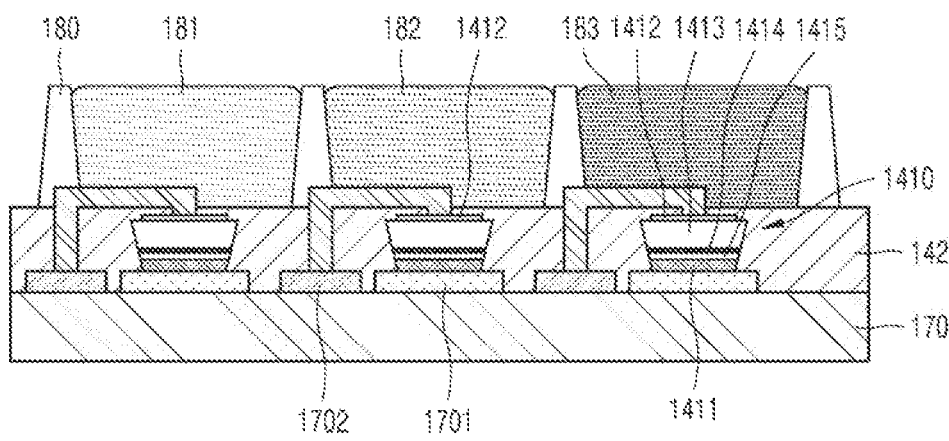

FIG. 20 illustrates a micro semiconductor chip transfer substrate according to another example embodiment.

In FIG. 20, micro semiconductor chips 1410 have a vertical electrode structure. Each of the micro semiconductor chips 1410 may include an n-type semiconductor layer 1413, an active layer 1414, and a p-type semiconductor layer 1415. A first electrode 1411 may be provided on the p-type semiconductor layer 1415, and a second electrode 1412 may be provided on the n-type semiconductor layer 1413. The micro semiconductor chips 1410 may be transferred to a driving circuit board 170, the first electrode 1411 may be connected to a first circuit 1701, and the second electrode 1412 may be connected to a second circuit 1702. An insulating layer 142 may be provided on the driving circuit board 170, and barriers 180 may be provided on the insulating layer 142 at a distance from each other, and first color conversion layer 181, the second color conversion layer 182, and the third color conversion layer 183 may be provided between the barriers 180. The first color conversion layer 181, the second color conversion layer 182, and the third color conversion layer 183 are the same as those described above, and thus descriptions thereof will be omitted.

Figure 21:
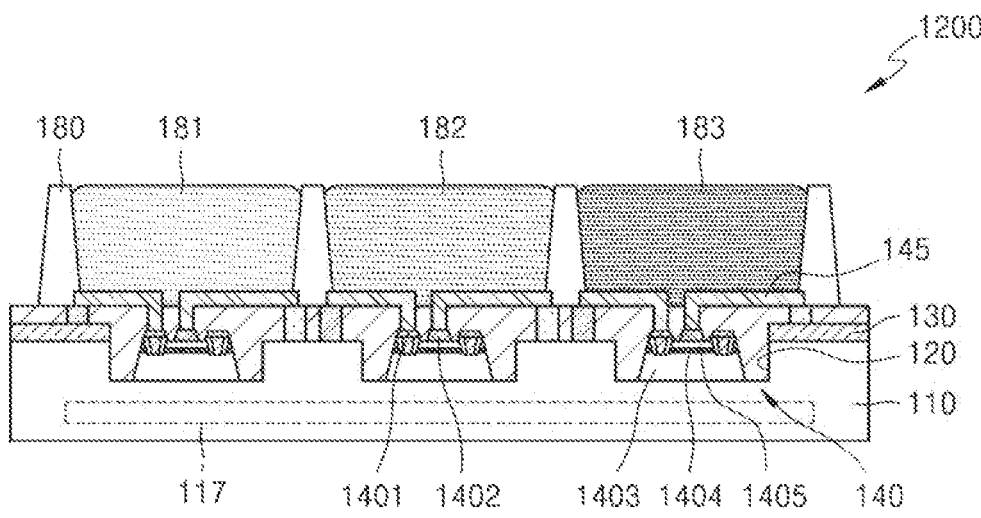

FIG. 21 schematically illustrates a micro semiconductor chip transfer substrate 1200 according to an example embodiment.

The micro semiconductor chip transfer substrate 1200 may include a base substrate 110 including a plurality of grooves 120, micro semiconductor chips 140 provided in the grooves 120, and guide rails 130 configured to guide the micro semiconductor chips 140. Each of the micro semiconductor chips 140 includes a first electrode 1401 and a second electrode 1402 on a surface facing an upper opening of the groove 120, but does not include any electrode on a surface facing a lower bottom of the groove 120. Each of the micro semiconductor chips 140 may include an n-type semiconductor layer 1403, an active layer 1404, and a p-type semiconductor layer 1405. In the example embodiment, the base substrate 110 may include a driving circuit 117, and the first electrode 1401 and the second electrode 1402 may be connected to the driving circuit 117. In addition, a first color conversion layer 181, a second color conversion layer 182, and a third color conversion layer 183 may be provided corresponding to the micro semiconductor chips 140. In this case, the micro semiconductor chips 140 transferred to the base substrate 110 are not needed to be transferred to another substrate.

Figure 22:
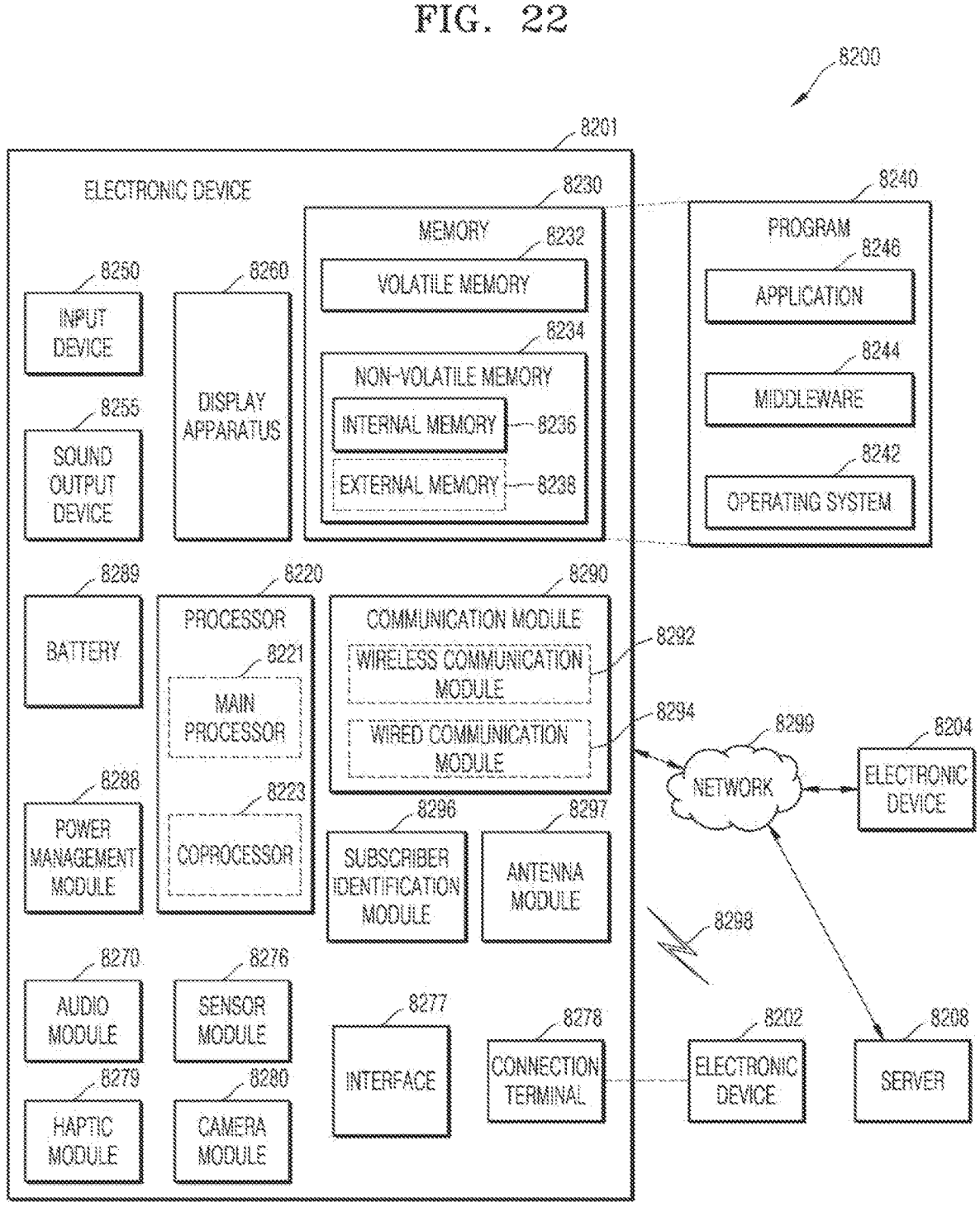
FIG. 22 is a schematic block diagram illustrating an electronic device according to an example embodiment.

FIG. 22 is a block diagram illustrating an electronic device 8201 including a display apparatus 8260 according to an example embodiment.

Referring to FIG. 22, the electronic device 8201 may be provided in a network environment 8200. In the network environment 8200, the electronic device 8201 may communicate with another electronic device 8202 through a first network 8298 (such as a short-range wireless communication network) or may communicate with another electronic device 8204 and/or a server 8208 through a second network 8299 (such as a long-range wireless communication network). The electronic device 8201 may communicate with the electronic device 8204 through the server 8208. The electronic device 8201 may include a processor 8220, a memory 8230, an input device 8250, a sound output device 8255, the display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of the components of the electronic device 8201 may be omitted, or other components may be added to the electronic device 8201. Some of the components may be implemented as one integrated circuit. For example, the sensor module 8276 (such as a fingerprint sensor, an iris sensor, or an illuminance sensor) may be embedded in the display apparatus 8260 (such as a display).

The processor 8220 may execute software (such as a program 8240) to control one or more other components (such as hardware or software components) of the electronic device 8201 which are connected to the processor 8220, and the processor 8220 may perform various data processing or operations. As part of data processing or computation, the processor 8220 may load commands and/or data received from other components (such as the sensor module 8276, the communication module 8290, etc.) on a volatile memory 8232, process the commands and/or data stored in the volatile memory 8232, and store resulting data in a non-volatile memory 8234. The non-volatile memory 8234 may include an internal memory 8236 and an external memory 8238. The processor 8220 may include: a main processor 8221 (such as a central processing unit, an application processor, etc.); and a coprocessor 8223 (such as a graphics processing unit, an image signal processor, a sensor hub processor, a communication processor, etc.) that may be operated independently or in conjunction with the main processor 8221. The coprocessor 8223 may consume less power than the main processor 8221 and may perform a specialized function.

The coprocessor 8223 may control functions and/or states related to some of the components (such as the display apparatus 8260, the sensor module 8276, and the communication module 8290) of the electronic device 8201, instead of the main processor 8221 while the main processor 8221 is in an inactive state (sleep mode) or together with the main processor 8221 while the main processor 8221 is in an active state (application-execution mode). The coprocessor 8223 (such as an image signal processor, a communication processor, etc.) may be implemented as part of a functionally related component (such as the camera module 8280 or the communication module 8290).

The memory 8230 may store various pieces of data required by the components (such as the processor 8220, the sensor module 8276, etc.) of the electronic device 8201. For example, the data may include: software (such as the program 8240); and instruction input data and/or output data which are related to the software. The memory 8230 may include the volatile memory 8232 and/or the non-volatile memory 8234.

The program 8240 may be stored as software in the memory 8230 and may include an operating system 8242, middleware 8244, and/or an application 8246.

The input device 8250 may receive, from outside the electronic device 8201 (for example, a user), commands and/or data to be used in the components (such as the processor 8220) of the electronic device 8201. The input device 8250 may include a remote controller, a microphone, a mouse, a keyboard, and/or a digital pen (such as a stylus pen).

The sound output device 8255 may output a sound signal to the outside of the electronic device 8201. The sound output device 8255 may include a speaker and/or a receiver. The speaker may be used for general purposes such as multimedia playback or recorded data playback, and the receiver may be used to receive incoming calls. The receiver may be integrated as a part of the speaker or may be implemented as an independent separate device.

The display apparatus 8260 may provide information to the outside of the electronic device 8201 in a visual manner. The display apparatus 8260 may include a device such as a display, a hologram device, or a projector, and a control circuit for controlling the device. The display apparatus 8260 may include a display apparatus manufactured using one or more of the micro semiconductor chip transfer substrates described with reference to FIGS. 1 to 20. The display apparatus 8260 may include: touch circuitry configured to detect touches; and/or a sensor circuit (such as a pressure sensor) configured to measure the magnitudes of forces generated by touches.

The audio module 8270 may convert a sound into an electric signal or may conversely convert an electric signal into a sound. The audio module 8270 may acquire a sound through the input device 8250, or may output a sound through the sound output device 8255 and/or the speaker and/or headphone of another electronic device (such as the electronic device 8202) which are directly or wirelessly connected to the electronic device 8201.

The sensor module 8276 may detect an operating state (such as the power or the temperature) of the electronic device 8201 or an external environmental state (such as a user state) and may generate an electrical signal and/or a data value corresponding to the detected state. The sensor module 8276 may include a gesture sensor, a gyro sensor, a barometric pressure sensor, a magnetic sensor, an acceler-ometer sensor, a grip sensor, a proximity sensor, a color sensor, an infrared (IR) sensor, a biometric sensor, a tem-perature sensor, a humidity sensor, and/or an illumination sensor.

The interface 8277 may support one or more designated protocols that may be used by the electronic device 8201 for directly or wirelessly connection with another electronic device (such as the electronic device 8202). The interface 8277 may include a high-definition multimedia Interface (HDMI), a universal serial bus (USB) interface, a secure digital (SD) card interface, and/or an audio interface.

A connection terminal 8278 may include a connector through which the electronic device 8201 may be physically connected to another electronic device (such as the elec-tronic device 8202). The connection terminal 8278 may include an HDMI connector, an USB connector, an SD card connector, and/or an audio connector (such as a headphone connector).

The haptic module 8279 may convert an electrical signal into a mechanical stimulus (such as vibration, movement, etc.) or an electrical stimulus that a user may perceive by the tactile or kinesthetic sense. The haptic module 8279 may include a motor, a piezoelectric element, and/or an electrical stimulation device.

The camera module 8280 may capture still images and moving images. The camera module 8280 may include a lens assembly including one or more lenses, image sensors, image signal processors, and/or flashes. The lens assembly of the camera module 8280 may collect light coming from a subject to be imaged.

The power management module 8288 may manage power supplied to the electronic device 8201. The power manage-ment module 8388 may be implemented as part of a power management integrated circuit (PMIC).

The battery 8289 may supply power to the components of the electronic device 8201. The battery 8289 may include non-rechargeable primary cells, rechargeable secondary cells, and/or fuel cells.

The communication module 8290 may support the estab-lishment of a direct (wired) communication channel and/or a wireless communication channel between the electronic device 8201 and another electronic device (such as the electronic device 8202, the electronic device 8204, or the server 8208), and may support communication through the established communication channel. The communication module 8290 may include one or more communication processors that operate independently of the processor 8220 (such as an application processor) and support direct com-munication and/or wireless communication. The communi-cation module 8290 may include: a wireless communication module 8292 (such as a cellular communication module, a short-range wireless communication module, or a global navigation satellite system (GNSS) communication mod-ule); and/or a wired communication module 8294 (such as a local area network (LAN) communication module or a power line communication module). The communication modules 8282 and 8294 may communicate with another electronic device through the first network 8298 (for example, a short-range communication network such as Bluetooth, WiFi direct, or infrared data association (IrDA)), or the second network 8299 (for example, a long-range communication network such as a cellular network, the Internet, or a computer network (LAN, WAN, etc.)). Such various types of communication modules may be integrated into one component (single chip, etc.) or may be imple-mented as a plurality of components (plural chips) separate from each other. The wireless communication module 8292 may identify and authenticate the electronic device 8201 in a communication network such as the first network 8298 and/or the second network 8299 by using subscriber infor-mation (such as an international mobile subscriber identifier (IMSI)) stored in the subscriber identification module 8296.

The antenna module 8297 may transmit or receive signals and/or power to or from the outside (for example, other electronic devices). An antenna may include a radiator which has a conductive pattern formed on a substrate (such as a PCB). The antenna module 8297 may include one or a plurality of such antennas. When the antenna module 8297 include a plurality of antennas, the communication module 8290 may select one of the plurality of antennas which is suitable for a communication method used in a communi-cation network such as the first network 8298 and/or the second network 8299. Signals and/or power may be trans-mitted between the communication module 8290 and another electronic device through the selected antenna. In addition to the antennas, other components (such as a radio-frequency integrated circuit (RFIC)) may be included as part of the antenna module 8297.

Some of the components may be connected to each other and exchange signals (such as commands or data) by an inter-peripheral communication scheme (such as a bus, general purpose input and output (GPIO), serial peripheral interface (SPI), or mobile industry processor interface (MIPI)).

Commands or data may be transmitted between the elec-tronic device 8201 and the (external) electronic device 8204 through the server 8208 connected to the second network 8299. The other electronic devices 8202 and 8204 and the electronic device 8201 may be the same type of electronic device or may be different types of electronic devices. All or some of operations of the electronic device 8201 may be executed in one or more of the other electronic devices 8202 and 8204, and the server 8208. For example, when the electronic device 8201 needs to perform a certain function or service, the electronic device 8201 may request one or more other electronic devices to perform a part or all of the function or service instead of performing the function or service by itself. The one or more other electronic devices receiving the request may perform an additional function or service related to the request, and may transmit results thereof to the electronic device 8201. To this end, cloud computing, distributed computing, and/or client-server com-puting techniques may be used.

Figure 23:
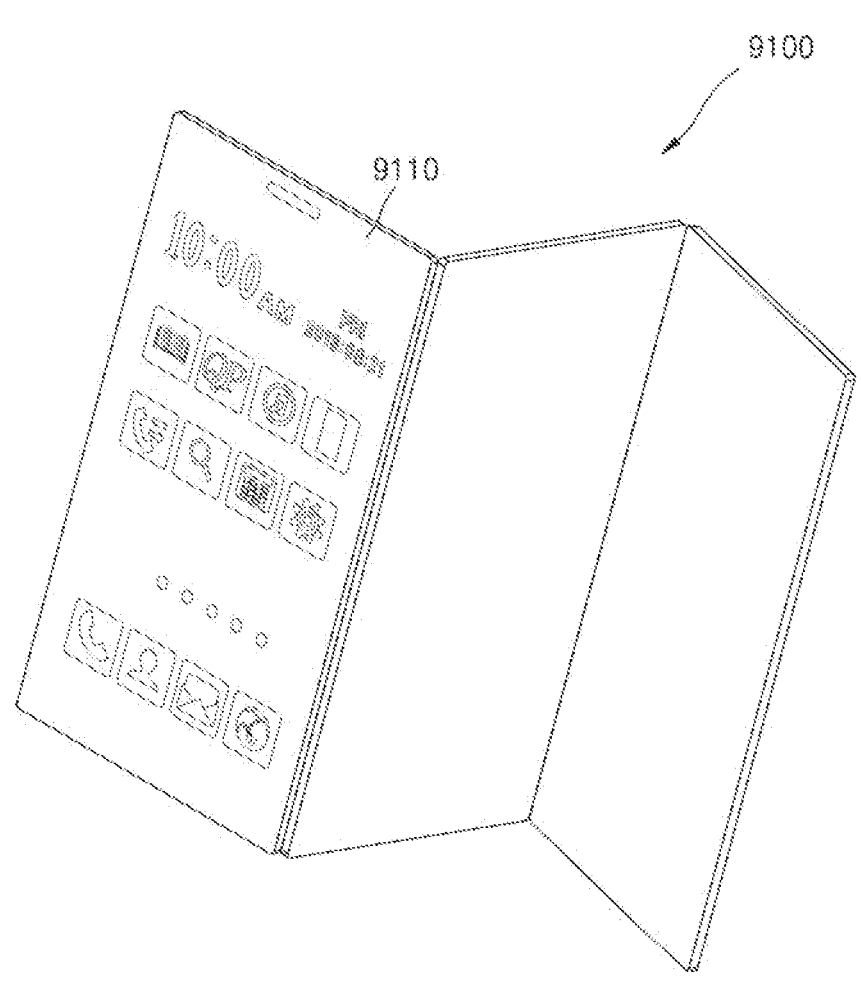
FIG. 23 is a view illustrating an example in which a display apparatus is applied to a mobile device according to an example embodiment.

FIG. 23 is a view illustrating an example in which an electronic device is applied to a mobile device 9100 accord-ing to an example embodiment. The mobile device 9100 may include a display apparatus 9110, and the display apparatus 9110 may include a display apparatus manufac-tured using one or more of the micro semiconductor chip transfer substrates described with reference to FIGS. 1 to 20. The display apparatus 9110 may have a foldable structure such as a multi-foldable structure.

Figure 24:
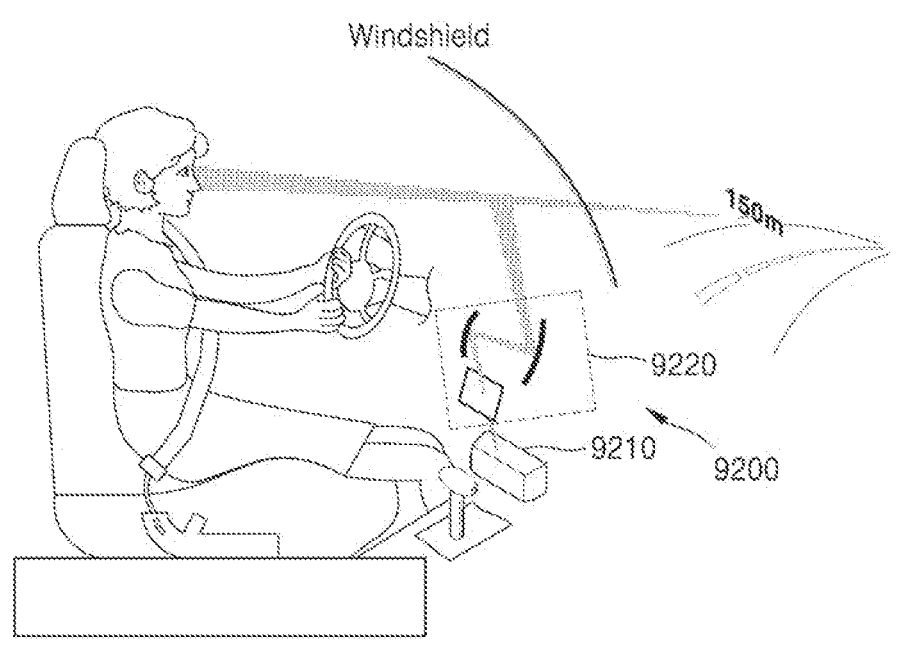
FIG. 24 is a view illustrating an example in which a display apparatus is applied to a vehicular display apparatus according to an example embodiment.

FIG. 24 is a view illustrating an example in which a display apparatus is applied to a vehicle according to an example embodiment. The display apparatus may be a vehicular head-up display apparatus 9200, and may include: a display 9210 provided in a region of the vehicle; and an optical path changing member 9220 configured to change the optical path of light such that a driver may see images generated by the display 9210.

Figure 25:
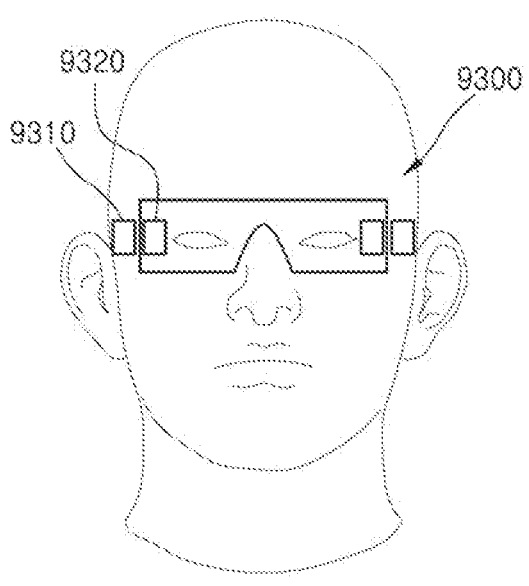
FIG. 25 is a view illustrating an example in which a display apparatus is applied to augmented reality glasses according to an example embodiment.

FIG. 25 is a view illustrating an example in which a display apparatus is applied to augmented reality glasses or virtual reality glasses according to an example embodiment. The augmented reality glasses 9300 may include a projection system 9310 configured to form images, and elements 9320 configured to guide the images from projection system 9310 into the eyes of a user. The projection system 9310 may include a display apparatus manufactured using one or more of the micro semiconductor chip transfer substrates described with reference to FIGS. 1 to 20.

Figure 26:
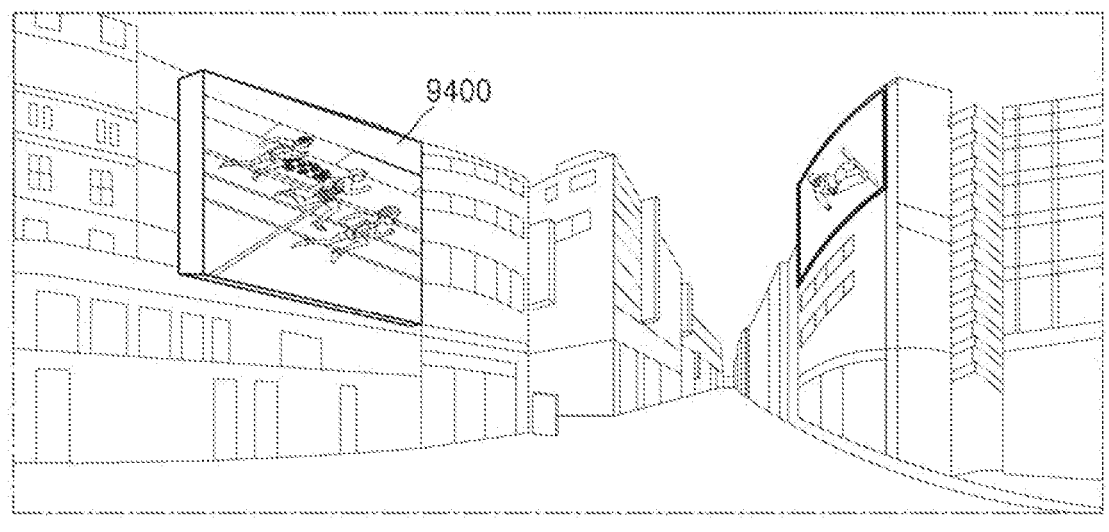
FIG. 26 is a view illustrating an example in which a display apparatus is applied to signage according to an example embodiment.

FIG. 26 is a view illustrating an example in which a display apparatus is applied to large signage 9400 according to an example embodiment. The signage 9400 may be used for outdoor advertisement using a digital information display and may control advertisement content and the like through a communication network. For example, the signage 9400 may be implemented through the electronic device 8201 described with reference to FIG. 22.

Figure 27:
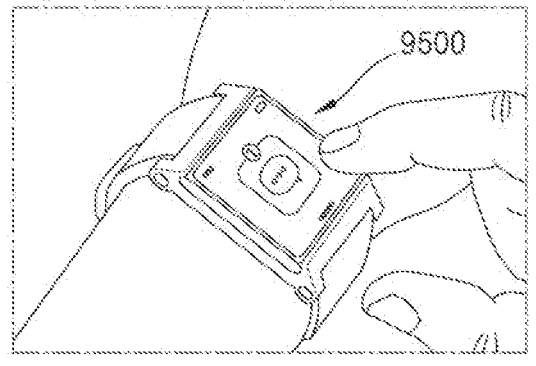
FIG. 27 is a view illustrating an example in which a display apparatus is applied to a wearable display according to an example embodiment.

FIG. 27 is a view illustrating an example in which a display apparatus is applied to a wearable display 9500 according to an example embodiment. The wearable display 9500 may include a display apparatus manufactured using one or more of the micro semiconductor chip transfer substrates described with reference to FIGS. 1 to 20 and may be implemented through the electronic device 8201 described with reference to FIG. 22.

The display apparatuses of the example embodiments may be applied to various products such as a rollable TV and a stretchable display.

As described above, according to the one or more of the above example embodiments, the micro semiconductor chip transfer substrate includes the guide rails arranged parallel to each other in the same direction along pixel lines of the base substrate, thereby increasing the transfer efficiency of micro semiconductor chips and reducing the rate of omission.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A micro semiconductor chip transfer substrate comprising:

a base substrate;

guide rails provided on the base substrate extending in a direction parallel to each other and spaced apart from each other; and a plurality of grooves provided in the base substrate between the guide rails and configured to accommodate micro semiconductor chips, wherein the base substrate comprises a plurality of pixels, a pixel among the plurality of pixels comprising three sub-pixels corresponding to three grooves among the plurality of grooves, respectively, and wherein the three sub-pixels are spaced apart from each other in a first direction perpendicular to a second direction in which the guide rails extend.

2. The micro semiconductor chip transfer substrate of claim 1, wherein the base substrate comprises a plurality of pixels comprising the pixel, and the guide rails extend parallel to each other in the second direction between the plurality of pixels, wherein one among the plurality of pixels corresponds to three among the plurality of grooves.

3. The micro semiconductor chip transfer substrate of claim 2, wherein the three sub-pixels comprise a first sub-pixel, a second sub-pixel, and a third sub-pixel, and wherein a gap between a first guide rail and the first sub-pixel closest to the first guide rail and a gap between a second guide rail and the third sub-pixel closest to the second guide rail are greater than a maximum width of the micro semiconductor chips.

4. The micro semiconductor chip transfer substrate of claim 2, wherein each of the three sub-pixels comprise a first sub-pixel, a second sub-pixel, and a third sub-pixel, and wherein a gap between the first sub-pixel and the second sub-pixel and a gap between the second sub-pixel and the third sub-pixel are greater than a maximum width of the micro semiconductor chips.

5. The micro semiconductor chip transfer substrate of claim 1, wherein the base substrate comprises a plurality of pixels comprising the pixel, and two or more pixels among the plurality of pixels are provided between the guide rails in the second direction.

6. The micro semiconductor chip transfer substrate of claim 1, wherein the base substrate comprises a substrate and a transfer mold provided on the substrate, and wherein the plurality of grooves are provided in the transfer mold.

7. The micro semiconductor chip transfer substrate of claim 1, wherein the guide rails are configured to attachable to and detachable from the base substrate.

8. The micro semiconductor chip transfer substrate of claim 1, wherein the three sub-pixels comprise a first sub-pixel, a second sub-pixel, and a third sub-pixel, and wherein a groove included in in the first sub-pixel, a groove included in the second sub-pixel, and a groove included in the third sub-pixel have different cross-sectional shapes from each other.

9. The micro semiconductor chip transfer substrate of claim 1, wherein the base substrate comprises a plurality of pixels comprising the pixel, and the guide rails comprise protrusions protruding between the plurality of pixels.

10. The micro semiconductor chip transfer substrate of claim 1, wherein the plurality of grooves comprise a first groove, a second groove, and a third groove, and wherein the first groove, the second groove, and the third groove are provided in a line in the first direction, in a zigzag pattern, or in a diagonal direction between the guide rails.

11. The micro semiconductor chip transfer substrate of claim 1, wherein an entrance portion of each of the guide rails has a tapered structure having a gradually decreasing width.

12. The micro semiconductor chip transfer substrate of claim 1, further comprising sub-guide rails provided between the guide rails, the sub-guide rails being configured to guide the micro semiconductor chips toward the plurality of grooves.

13. The micro semiconductor chip transfer substrate of claim 1, further comprising a fine concavo-convex pattern on surfaces of the guide rails and the base substrate.

14. The micro semiconductor chip transfer substrate of claim 1, wherein the micro semiconductor chips comprise at least one of a light emitting diode (LED), a complementary metal-oxide semiconductor (CMOS), a CMOS image sensor (CIS), a vertical-cavity surface-emitting laser (VCSEL), a photodiode (PD), a memory device, or a two-dimensional (2D) material device.

15. The micro semiconductor chip transfer substrate of claim 1, wherein the micro semiconductor chips are transferred in the grooves.

* * * * *